(12) United States Patent
Lee

(10) Patent No.: US 8,183,083 B2
(45) Date of Patent: May 22, 2012

(54) METHOD FOR MANUFACTURING BACK SIDE ILLUMINATION IMAGE SENSOR

(75) Inventor: Yong Geun Lee, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 353 days.

(21) Appl. No.: 12/641,986

(22) Filed: Dec. 18, 2009

(65) Prior Publication Data

US 2010/0167445 A1 Jul. 1, 2010

(30) Foreign Application Priority Data

Dec. 31, 2008 (KR) ........................ 10-2008-0137943

(51) Int. Cl.
*H01L 21/00* (2006.01)

(52) U.S. Cl. .............................. 438/94; 438/48; 257/461

(58) Field of Classification Search .................... 438/48, 438/94, 57, 459, 977; 257/228, 460, 461, 257/E31.057, E31.073, 292

See application file for complete search history.

(56) References Cited

U.S. PATENT DOCUMENTS

| 2005/0139828 A1* | 6/2005 | Maruyama et al. ............. 257/59 |
| 2009/0200589 A1* | 8/2009 | Qian et al. .................... 257/292 |

* cited by examiner

*Primary Examiner* — Matthew Landau
*Assistant Examiner* — Sonya McCall Shepard
(74) *Attorney, Agent, or Firm* — Saliwanchik, Lloyd & Eisenschenk

(57) ABSTRACT

Disclosed is a method for manufacturing a back side illumination image sensor. The method includes defining a pixel area by forming a first isolation area in a first substrate; forming a photo detecting unit buried in the pixel area; forming an ion implantation layer on the photo detecting unit; growing a second substrate on the first substrate having the ion implantation layer; forming a logic unit electrically connected to the first substrate on the second substrate; forming an insulting layer and an interconnection on the second substrate; and exposing the photo detecting unit by grinding a backside of the first substrate.

9 Claims, 3 Drawing Sheets

METHOD FOR MANUFACTURING BACK SIDE ILLUMINATION IMAGE SENSOR

CROSS-REFERENCE TO RELATED APPLICATION

This application claims the benefit under 35 U.S.C. §119 of Korean Patent Application No. 10-2008-0137943, filed Dec. 31, 2008, which is hereby incorporated by reference in its entirety.

BACKGROUND

An image sensor is a semiconductor device that converts optical images into electrical signals.

The image sensor includes a photo detecting unit that detects light and a logic circuit unit that processes detected light into an electrical signal to make data.

In order to improve photo sensitivity of the image sensor, a fill factor, which is a ratio of the photo detecting unit to the whole area of the image sensor, must be increased. However, since the logic circuit part is an essential element in the image sensor, the expansion of the area of the photo detecting unit is limited by the logic circuit part.

BRIEF SUMMARY

An embodiment provides a method for manufacturing a back side illumination image sensor, capable of increasing an area of a photo detecting unit within a limited design rule.

A method for manufacturing a back side illumination image sensor according to an embodiment includes defining a pixel area by forming a first isolation area in a first substrate; forming a photo detecting unit buried in the pixel area; forming an ion implantation layer on the photo detecting unit; growing a second substrate on the first substrate having the ion implantation layer; forming a logic unit electrically connected to the first substrate on the second substrate; forming an insulting layer and an interconnection on the second substrate; and exposing the photo detecting unit by grinding a backside of the first substrate.

In addition, a method for manufacturing a back side illumination image sensor according to another embodiment includes defining a pixel area by forming a first isolation area in a first substrate; forming a photo detecting unit buried in the pixel area at a depth corresponding to a depth of the first isolation area; forming an ion implantation layer in a region ranging from a top surface of the photo detecting unit to a top surface of the first substrate by implanting ions into the pixel area remaining over the photo detecting unit; growing an epitaxial silicon layer on the first substrate having the ion implantation layer; forming a transistor electrically connected to the photo detecting unit on the epitaxial silicon layer; forming an insulting layer and an interconnection on the epitaxial silicon layer having the transistor; and exposing the photo detecting unit by grinding a backside of the first substrate.

DETAILED DESCRIPTION

Hereinafter, an image sensor and a method for manufacturing the same will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

FIGS. 1 to 8 are cross-sectional views showing the procedure for manufacturing a back side illumination image sensor according to an embodiment.

Figure 1:
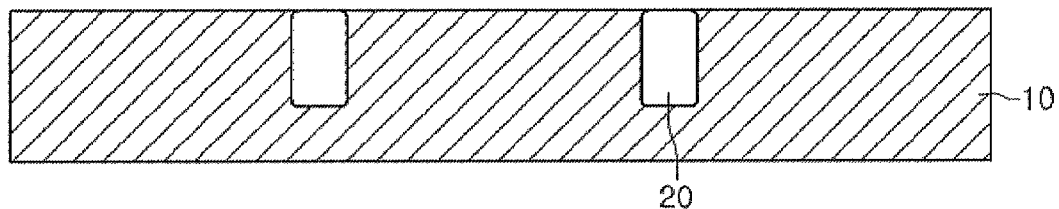
FIGS. 1 to 8 are cross-sectional views showing the procedure for manufacturing a back side illumination image sensor according to an embodiment.

As shown in FIG. 1, first isolation areas 20 that define pixel areas are formed on a first substrate 10.

The first isolation areas 20 have a predetermined depth from a top surface of the first substrate 10 to electrically isolate devices from each other. The first isolation areas 20 can be formed through an STI (shallow trench isolation) process. According to the STI process, the first isolation areas 20 are defined in the first substrate 10 through patterning and etching processes, and then an oxide layer is deposited and planarized such that the first isolation areas 20 may have insulation property.

Figure 2:
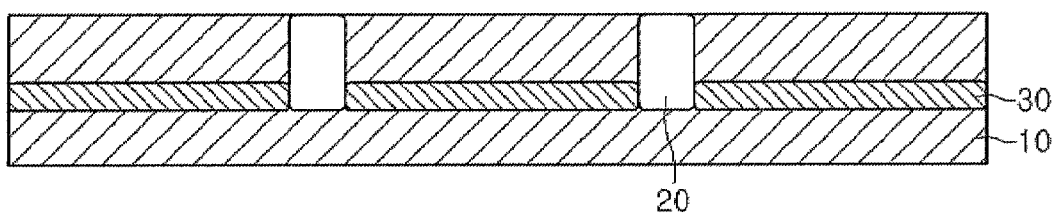

As shown in FIG. 2, a photo detecting unit 30 is buried in the pixel areas defined by the first isolation areas 20.

The photo detecting unit 30 may include a photodiode, but the embodiment is not limited thereto. The photo detecting unit 30 can be formed by implanting N-type ions into a P-type first substrate 10. The photo detecting unit 30 buried in the first substrate 10 is isolated by the first isolation areas 20, and a bottom surface of the photo detecting unit 30 is in line with a bottom surface of the first isolation areas 20.

Figure 3:
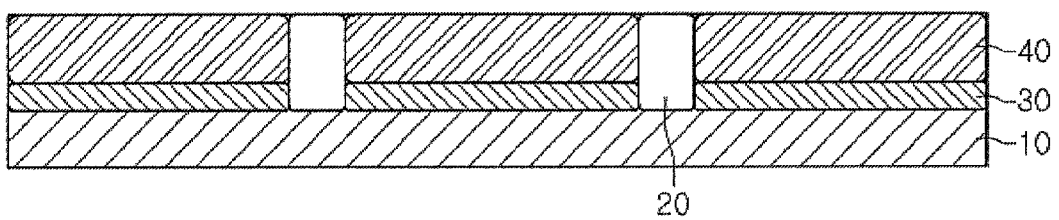

Then, as shown in FIG. 3, an ion implantation layer 40 is formed on the photo detecting unit 30.

The ion implantation layer 40 is formed on the whole area of the first substrate 10 remaining on the photo detecting unit 30 buried in the first substrate 10. Thus, the first isolation areas 20 and the ion implantation layer 40 are formed at the top surface of the first substrate 10. At this time, the ion implantation layer 40 is formed in the pixel areas defined by the first isolation areas 20 in line with the first isolation areas 20.

The ion implantation layer 40 can be formed by implanting P-type ions onto the photo detecting unit 30, which is an N-type ion implantation area. Due to the ion implantation area doped with the P-type ions, extra electrons can be prevented. In addition, according to the embodiment, a PNP junction is formed to achieve charge dumping effect.

The photo detecting unit 30 and the ion implantation layer 40 manufactured through the above process may serve as a photodiode unit.

Figure 4:
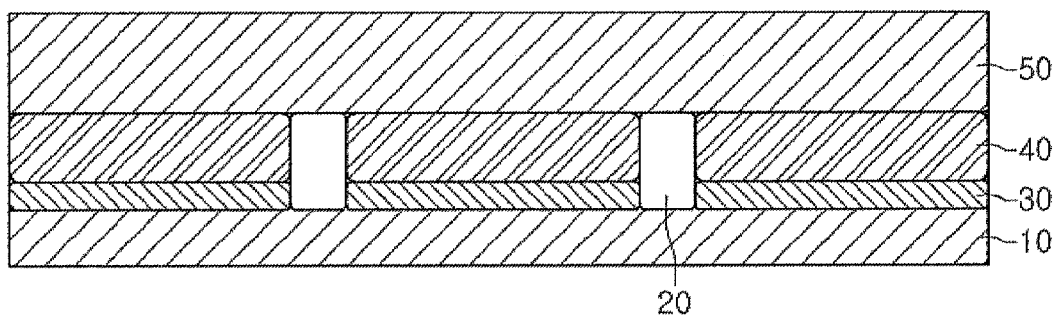

Then, as shown in FIG. 4, a second substrate 50 is grown on the ion implantation layer 40 and the first isolation areas 20.

The second substrate 50 can be formed by growing epitaxial silicon. A logic unit is formed in the second substrate 50 to process optical signals received through the photodiode unit.

Figure 5:
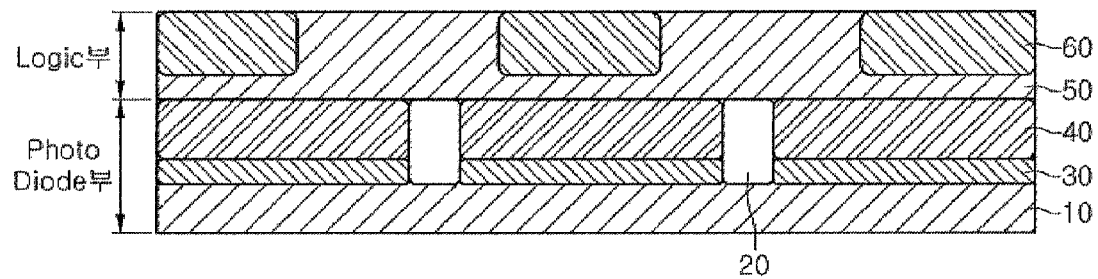

Referring to FIG. 5, second isolation areas 60 are formed on the upper portion of the second substrate 50 in correspondence with the pixel areas.

The second isolation areas 60 have a predetermined depth from a top surface of the second substrate 50 and can be formed through an STI process. According to the STI process, the second isolation areas 60 are defined in the first substrate 10 through patterning and etching processes, and then an oxide layer is deposited and planarized such that the second isolation areas 60 may have insulation property.

Figure 6:
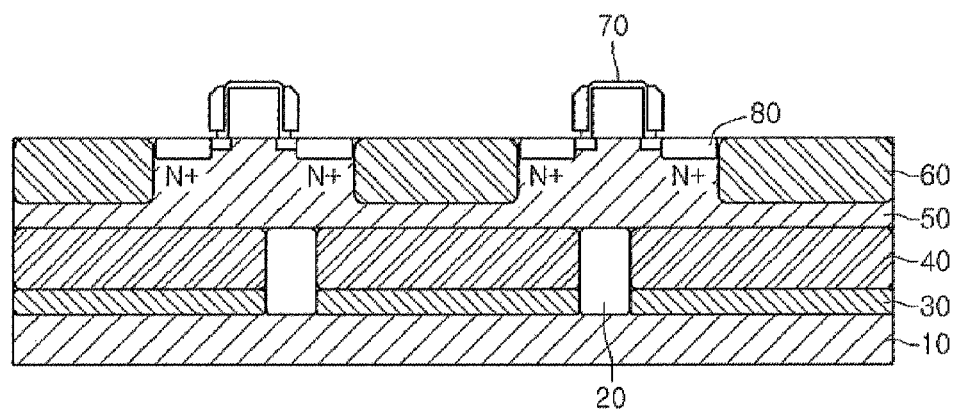

Then, as shown in FIG. 6, logic gates 70 and sources/drains 80 are formed on the top surface of the second substrate 50 defined by the second isolation areas 60, thereby forming a plurality of transistors.

The source/drain 80 can be formed by implanting N-type ions into the second substrate 50, and the gate 70 can be formed by depositing and etching gate material on the second substrate 50. The transistors may include a transfer transistor, a reset transistor, a drive transistor and a select transistor, but the embodiment is not limited thereto. The transistors formed on the second substrate 50 may serve as a logic unit for processing signals of the photodiode unit.

Figure 7:
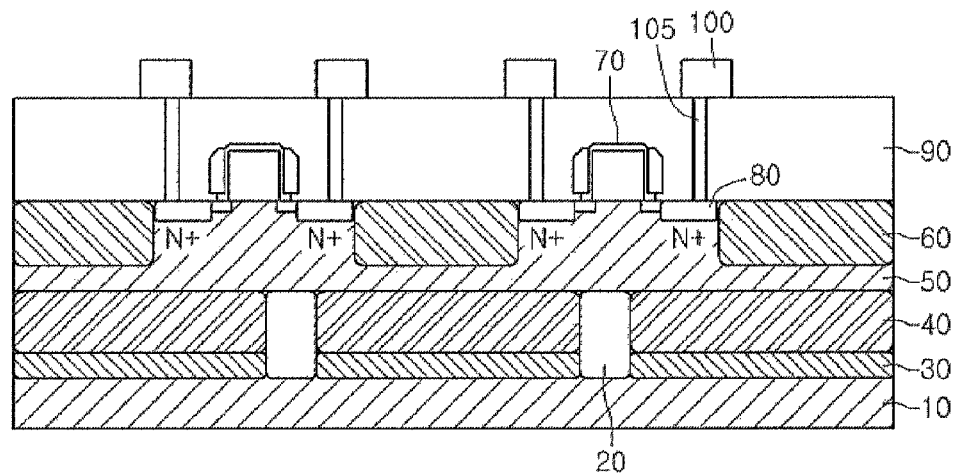

Then, as shown in FIG. 7, an interconnection 105 and an insulating layer 90 are formed on the second substrate 50, and a pad 100 connected to the interconnection is exposed on the insulating layer 90. The interconnection 105 may include metallic material.

Figure 8:
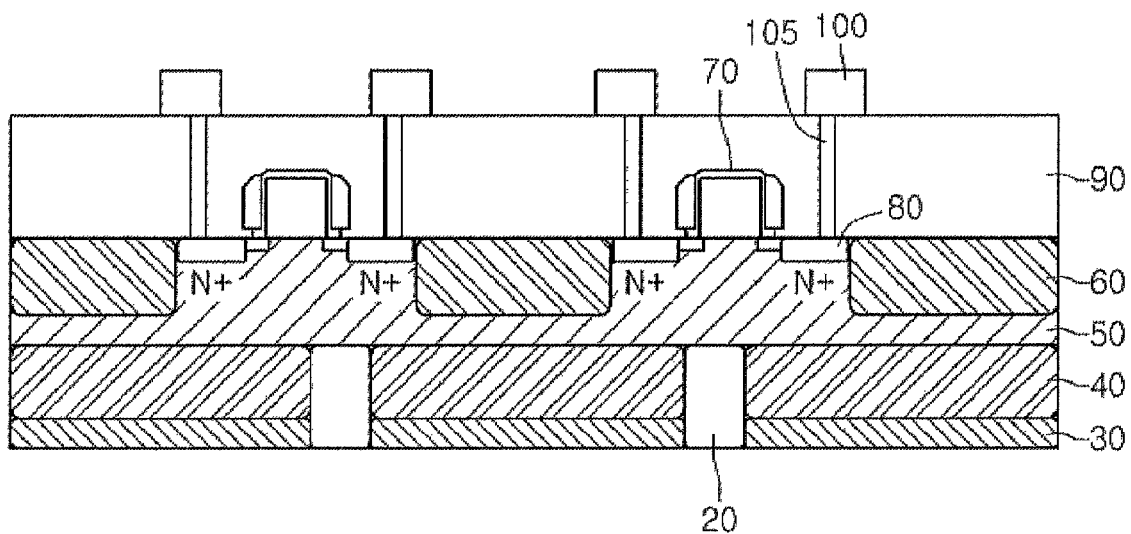

After that, as shown in FIG. 8, a backside of the first substrate 10 is removed through a grinding process, thereby exposing the photo detecting unit 30.

A color filter can be formed on the photo detecting unit 30, and a microlens can be formed on the color filter. If the photo detecting unit 30 is a photodiode having R, G and B layers which are vertically stacked, the color filter can be omitted.

As described above, according to the method for manufacturing the back side illumination image sensor of an embodiment, the photodiode unit is formed by burying the photo detecting unit 30 in the first substrate, and the logic unit including a driving circuit, such as a transistor, is formed by growing the second substrate 50 on the first substrate 10 having the photodiode unit. Then, the backside of the first substrate is removed through a grinding process, thereby exposing the photo detecting unit 30.

In this manner, the photodiode unit and the logic unit are stacked in the image sensor, so that the photo detecting area can be increased within a limited design rule.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a back side illumination image sensor, the method comprising:

defining a pixel area by forming a first isolation area in a first substrate;

forming a photo detecting unit buried in the pixel area;

forming an ion implantation layer on the photo detecting unit;

growing a second substrate on the first substrate having the ion implantation layer;

forming a logic unit electrically connected to the first substrate on the second substrate;

forming an insulting layer and an interconnection on the second substrate; and exposing the photo detecting unit by grinding a backside of the first substrate.

2. The method of claim 1, wherein the forming of the photo detecting unit buried in the pixel area includes forming a bottom surface of the photo detecting unit in line with a bottom surface of the first isolation area.

3. The method of claim 1, wherein the first substrate is P-type, and wherein the forming of the photo detecting unit buried in the pixel area includes implanting N-type ions into the P-type first substrate.

4. The method of claim 1, wherein the growing of the second substrate on the first substrate having the ion implantation layer includes growing an epitaxial silicon layer on the first substrate.

5. The method of claim 1, wherein the forming of the logic unit electrically connected to the first substrate on the second substrate includes:

forming a second isolation area in the second substrate; and forming a transistor including a gate and a source/drain in each active area defined by the second isolation area.

6. The method of claim 3, wherein the forming of the ion implantation layer on the photo detecting unit includes implanting P-type ions into the first substrate on the photo detecting unit.

7. A method for manufacturing a back side illumination image sensor, the method comprising:

defining a pixel area by forming a first isolation area in a first substrate;

forming a photo detecting unit buried in the pixel area at a depth corresponding to a depth of the first isolation area;

forming an ion implantation layer in a region ranging from a top surface of the photo detecting unit to a top surface of the first substrate by implanting ions into the pixel area remaining over the photo detecting unit;

growing an epitaxial silicon layer on the first substrate having the ion implantation layer;

forming a transistor electrically connected to the photo detecting unit on the epitaxial silicon layer;

forming an insulting layer and an interconnection on the epitaxial silicon layer having the transistor; and exposing the photo detecting unit by grinding a backside of the first substrate.

8. The method of claim 7, wherein the first substrate is P-type, and wherein the forming of the photo detecting unit buried in the pixel area includes implanting N-type ions into the P-type first substrate.

9. The method of claim 7, wherein the forming of the ion implantation layer includes implanting P-type ions into the first substrate above the photo detecting unit.

* * * * *